United States Patent
Drogi

(10) Patent No.: US 11,929,769 B2
(45) Date of Patent: Mar. 12, 2024

(54) POWER AMPLIFIER TRIMMING BASED ON COEFFICIENTS FOR DIGITAL PRE-DISTORTION

(71) Applicant: Skyworks Solutions, Inc., Irvine, CA (US)

(72) Inventor: Serge Francois Drogi, Flagstaff, AZ (US)

(73) Assignee: Skyworks Solutions, Inc., Irvine, CA (US)

( * ) Notice: Subject to any disclaimer, the term of this patent is extended or adjusted under 35 U.S.C. 154(b) by 107 days.

(21) Appl. No.: 17/664,817

(22) Filed: May 24, 2022

(65) Prior Publication Data

US 2022/0385313 A1 Dec. 1, 2022

Related U.S. Application Data

(60) Provisional application No. 63/202,169, filed on May 28, 2021.

(51) Int. Cl.
*H04B 1/04* (2006.01)
*H03F 3/24* (2006.01)

(52) U.S. Cl.
CPC .............. *H04B 1/04* (2013.01); *H03F 3/245* (2013.01); *H03F 2200/451* (2013.01); *H04B 2001/0425* (2013.01)

(58) Field of Classification Search
CPC .... H04B 2001/0408; H04B 2001/0425; H04B 1/0483; H04B 1/0475; H03F 2200/451; H03F 1/3241
See application file for complete search history.

(56) References Cited

U.S. PATENT DOCUMENTS

| | | |
|---|---|---|
| 4,389,619 A | 6/1983 | Limberg |
| 4,457,725 A | 7/1984 | Kern et al. |
| 4,462,002 A | 7/1984 | Schade, Jr. |
| 4,618,833 A | 10/1986 | Russell |
| 4,683,442 A | 7/1987 | Vyne |
| 4,717,886 A | 1/1988 | Davis et al. |
| 5,034,699 A | 7/1991 | Powell |
| 5,180,988 A | 1/1993 | McDaniel |
| 5,216,385 A | 6/1993 | McDaniel |
| 5,610,557 A | 3/1997 | Jett, Jr. |

(Continued)

*Primary Examiner* — Aristocratis Fotakis
(74) *Attorney, Agent, or Firm* — Knobbe, Martens, Olson & Bear, LLP

(57) ABSTRACT

Apparatus and methods for power amplifier trimming based on coefficients for digital pre-distortion (DPD) are disclosed. In certain embodiments, a mobile device includes a transmit circuit that generates a plurality of digital transmit signals. The transmit circuit includes a plurality of DPD circuits each operable to provide DPD to a corresponding one of the digital transmit signals, a coefficient comparator circuit that generates a trimming control signal based on a plurality of coefficients of the plurality of DPD circuits, and a plurality of digital to radio frequency (RF) converters that convert the digital transmit signals into a plurality of RF signals. The mobile device further includes a front end system including a plurality of power amplifiers each amplifying a respective one of the RF signals, and a power amplifier trimming circuit that controls trimming of the power amplifiers based on the trimming control signal.

20 Claims, 18 Drawing Sheets

(56) References Cited

U.S. PATENT DOCUMENTS

| | | |
|---|---|---|
| 5,821,810 A | 10/1998 | Swart et al. |
| 5,986,503 A | 11/1999 | Ichikawa |
| 5,991,219 A | 11/1999 | Nakashima |
| 6,194,962 B1 | 2/2001 | Chen |
| 6,396,339 B1 | 5/2002 | Jacobs |
| 6,696,894 B1 | 2/2004 | Huang |
| 7,109,697 B1 | 9/2006 | Atrash et al. |
| 9,337,792 B1 | 5/2016 | Shou |
| 10,027,295 B2 | 7/2018 | Tan et al. |
| 10,141,900 B2 | 11/2018 | Saxena et al. |
| 10,250,210 B2 | 4/2019 | Mengad et al. |
| 10,298,183 B2 | 5/2019 | Bellingham et al. |
| 10,868,504 B2 | 12/2020 | Ivanov et al. |
| 10,924,066 B2 | 2/2021 | Purdila et al. |
| 11,190,137 B2 | 11/2021 | Thoma |
| 11,227,640 B2 | 1/2022 | Shih et al. |
| 11,228,288 B2 | 1/2022 | Bellingham et al. |
| 2003/0155974 A1 | 8/2003 | Ivanov et al. |
| 2009/0108936 A1 | 4/2009 | Forejt |
| 2009/0237163 A1 | 9/2009 | Bhatacharya et al. |
| 2010/0213983 A1 | 8/2010 | Eschauzier et al. |
| 2011/0001560 A1 | 1/2011 | Eschauzier et al. |
| 2011/0025419 A1 | 2/2011 | Kimura |
| 2012/0133434 A1* | 5/2012 | Woo ................. H03F 1/3247 330/149 |
| 2015/0279473 A1 | 10/2015 | Yoo et al. |
| 2016/0173037 A1 | 6/2016 | Puscasu et al. |
| 2017/0149397 A1 | 5/2017 | Roy et al. |
| 2017/0353252 A1 | 12/2017 | Bellingham et al. |
| 2019/0089389 A1* | 3/2019 | Gutman ................. H03F 3/24 |
| 2020/0068570 A1* | 2/2020 | Khan ................. H04B 1/0475 |
| 2020/0169334 A1* | 5/2020 | Li ................. H03F 3/189 |
| 2021/0067114 A1 | 3/2021 | Ivanov et al. |
| 2021/0167731 A1 | 6/2021 | Agarwal et al. |
| 2021/0305945 A1* | 9/2021 | Pratt ................. H04B 1/0475 |
| 2022/0093142 A1 | 3/2022 | Shih et al. |
| 2022/0166389 A1* | 5/2022 | Hamid ................. H04B 7/0617 |
| 2022/0166390 A1 | 5/2022 | Zhang et al. |
| 2022/0198253 A1* | 6/2022 | Benosman ................. G06F 18/214 |
| 2022/0200539 A1* | 6/2022 | Benosman ................. H03F 3/211 |
| 2022/0209730 A1 | 6/2022 | Ivanov et al. |

* cited by examiner

POWER AMPLIFIER TRIMMING BASED ON COEFFICIENTS FOR DIGITAL PRE-DISTORTION

CROSS-REFERENCE TO RELATED APPLICATIONS

This application claims the benefit of priority under 35 U.S.C. § 119 of U.S. Provisional Patent Application No. 63/202,169, filed May 28, 2021 and titled "POWER AMPLIFIER TRIMMING BASED ON COEFFICIENTS FOR DIGITAL PRE-DISTORTION," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes a transmit circuit configured to generate a plurality of digital transmit signals. The transmit circuit includes a plurality of digital pre-distortion circuits each operable to provide digital pre-distortion to a corresponding one of the plurality of digital transmit signals in a first mode of the transmit circuit, a coefficient comparator circuit configured to generate a trimming control signal based on a plurality of coefficients of the plurality of digital pre-distortion circuits, and a plurality of digital to radio frequency converters configured to convert the plurality of digital transmit signals into a plurality of radio frequency signals. The transmit circuit further includes a front end system including a plurality of power amplifiers each configured to amplify a respective one of the plurality of radio frequency signals, and a power amplifier trimming circuit configured to control trimming of the plurality of power amplifiers based on the trimming control signal.

In some embodiments, in a second mode of the transmit circuit, a digital pre-distortion circuit of the plurality of digital pre-distortion circuits is configured to provide digital pre-distortion to two or more of the plurality of digital transmit signals. According to a number of embodiments, at least one of the plurality of digital pre-distortion circuits is disabled in the second mode to lower a power consumption of the transmit circuit. In accordance with several embodiments, the transmit circuit transitions from the first mode to the second mode after the power amplifier trimming circuit trims the plurality of power amplifiers in response to the trimming control signal.

In various embodiments, the power amplifier trimming circuit is configured to provide at least one of a transistor adjustment, a feedback capacitor adjustment, a bias adjustment, or a load line adjustment to one or more of the plurality of power amplifiers based on the trimming control signal.

In several embodiments, the mobile device further includes an antenna array configured to radiate a transmit beam in response to receiving a plurality of amplified radio frequency signals from the plurality of power amplifiers.

In some embodiments, the coefficient comparator circuit is configured to generate the trimming control signal based on a plurality of comparisons of the plurality of coefficients to one another.

In various embodiments, the front end system further includes a plurality of gain and phase adjustment circuits configured to provide a plurality of gain and phase adjustments to the plurality of radio frequency signals for beamforming.

In certain embodiments, the present disclosure relates to a method of digital pre-distortion in a mobile device. The method includes using a transmit circuit to generate a plurality of digital transmit signals, and to convert the plurality of digital transmit signals to a plurality of radio frequency signals. The method further includes, in a first mode of the transmit circuit, providing digital pre-distortion to each of the plurality of digital transmit signals using a plurality of digital pre-distortion circuits of the transmit circuit. The method further includes generating a trimming control signal based on a plurality of coefficients of the plurality of digital pre-distortion circuits using a coefficient comparator of the transmit circuit, amplifying the plurality of radio frequency signals using a plurality of power amplifiers, and trimming the plurality of power amplifiers based on the trimming control signal using a power amplifier trimming circuit.

In some embodiments, the method further includes using a digital pre-distortion circuit of the plurality of digital pre-distortion circuits to provide digital pre-distortion to two or more of the plurality of digital transmit signals in a second mode of the transmit circuit. According to a number of embodiments, the method further includes disabling at least one of the plurality of digital pre-distortion circuits in the second mode. In accordance with several embodiments, the method further includes transitioning the transmit circuit from the first mode to the second mode after trimming the plurality of power amplifiers in response to the trimming control signal.

In various embodiments, trimming the plurality of power amplifiers includes at least one of providing a transistor adjustment, providing a feedback capacitor adjustment, providing a bias adjustment, or providing a load line adjustment to one or more of the plurality of power amplifiers based on the trimming control signal.

In several embodiments, the method further includes radiating a transmit beam from an antenna array in response to receiving a plurality of amplified radio frequency signals from the plurality of power amplifiers.

In some embodiments, generating the trimming control signal includes performing a plurality of comparisons of the plurality of coefficients to one another.

In various embodiments, the method further includes providing a plurality of gain and phase adjustments to the plurality of radio frequency signals for beamforming using a plurality of gain and phase adjustment circuits.

In certain embodiments, the present disclosure relates to a radio frequency transmit system for a mobile device. The radio frequency transmit system includes a digital transmit circuit configured to generate a plurality of digital transmit signals. The digital transmit circuit includes a plurality of digital pre-distortion circuits each operable to provide digital pre-distortion to a corresponding one of the plurality of digital transmit signals in a first mode of the digital transmit circuit, and a coefficient comparator circuit configured to generate a trimming control signal based on a plurality of coefficients of the plurality of digital pre-distortion circuits. The radio frequency transmit system further includes a plurality of digital to radio frequency converters configured to convert the plurality of digital transmit signals into a plurality of radio frequency signals, and a power amplifier module including a plurality of power amplifiers each configured to amplify a respective one of the plurality of radio frequency signals, and a power amplifier trimming circuit configured to control trimming of the plurality of power amplifiers based on the trimming control signal.

In some embodiments, in a second mode of the digital transmit circuit, a digital pre-distortion circuit of the plurality of digital pre-distortion circuits is configured to provide digital pre-distortion to two or more of the plurality of digital transmit signals. According to a number of embodiments, at least one of the plurality of digital pre-distortion circuits is disabled in the second mode to lower a power consumption of the transmit circuit. In accordance with various embodiments, the transmit circuit transitions from the first mode to the second mode after the power amplifier trimming circuit trims the plurality of power amplifiers in response to the trimming control signal.

DETAILED DESCRIPTION OF EMBODIMENTS

Figure 1:
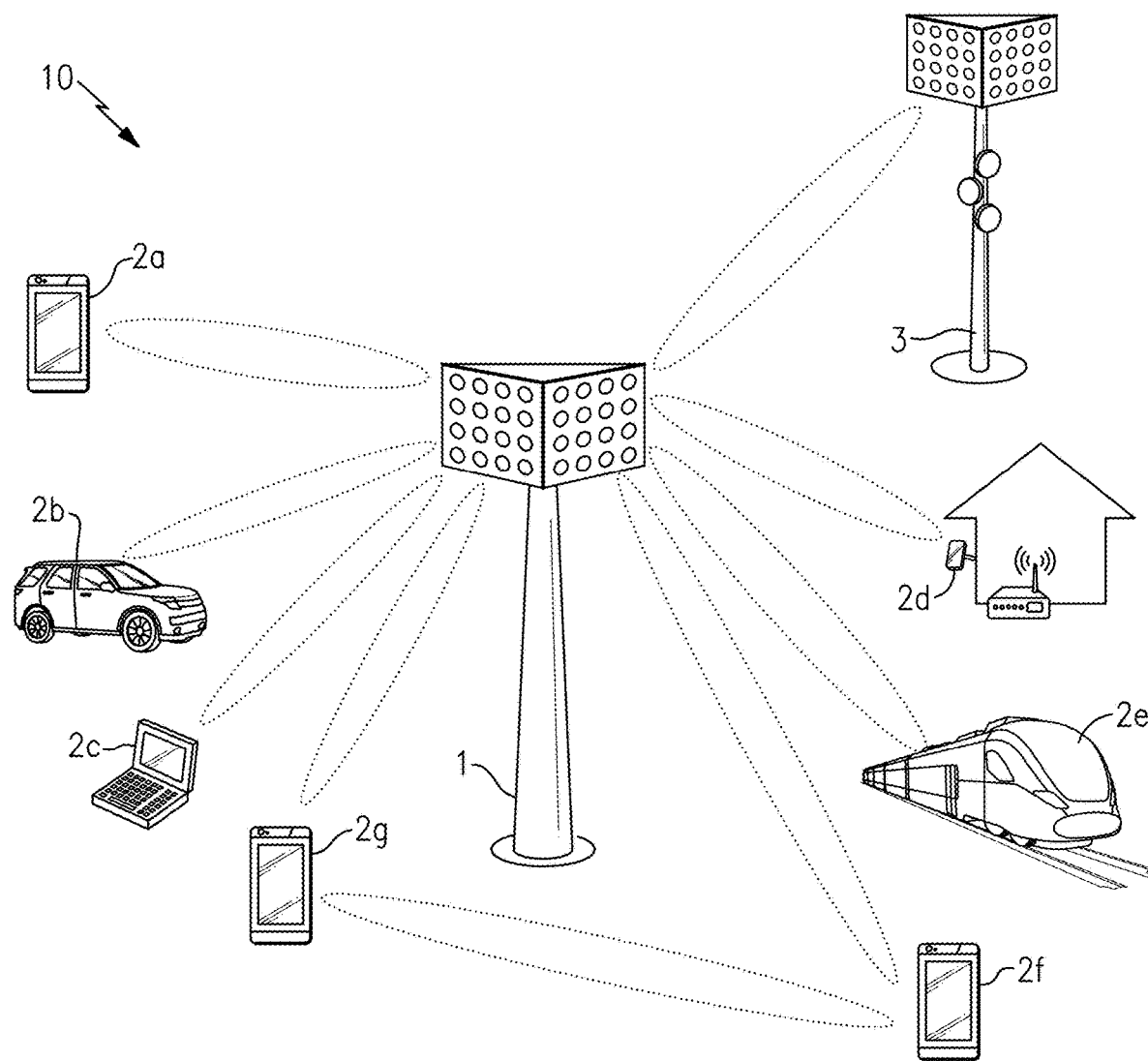
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
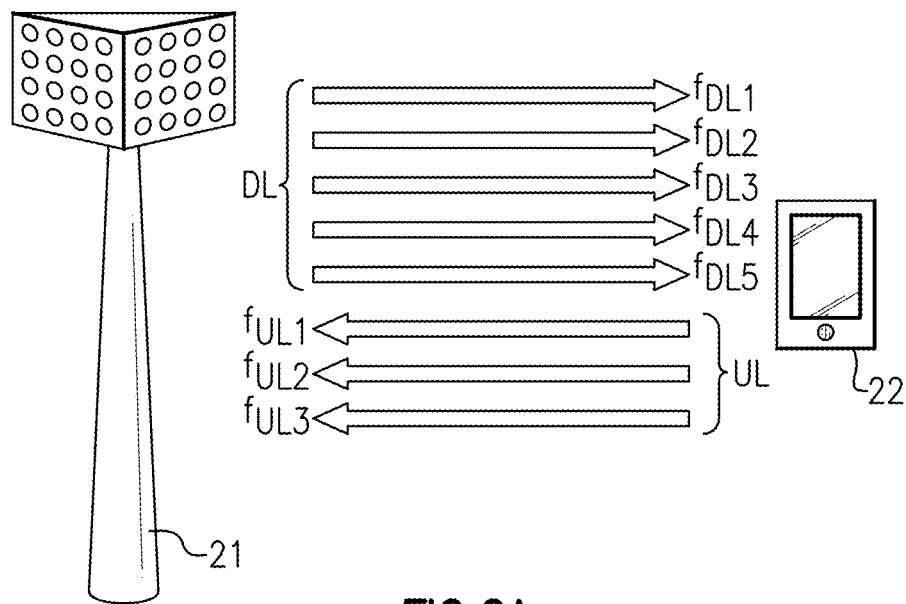
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
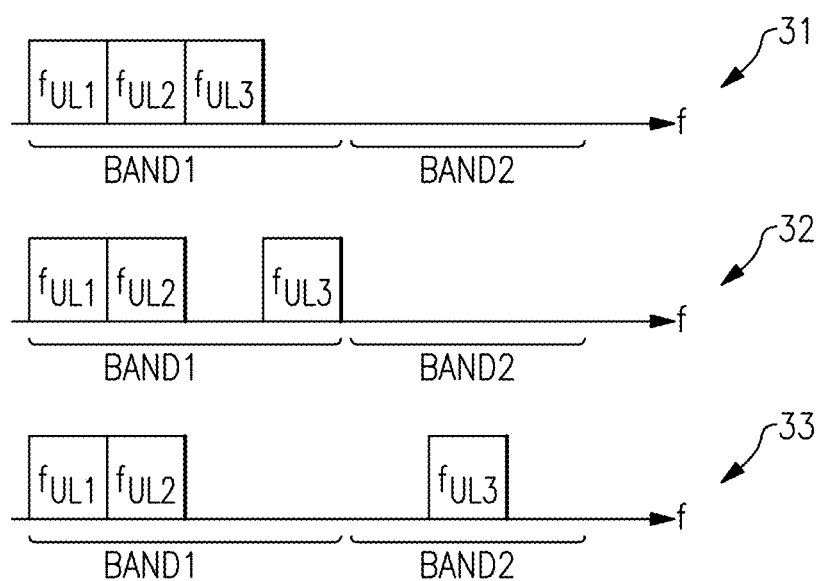
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier full, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
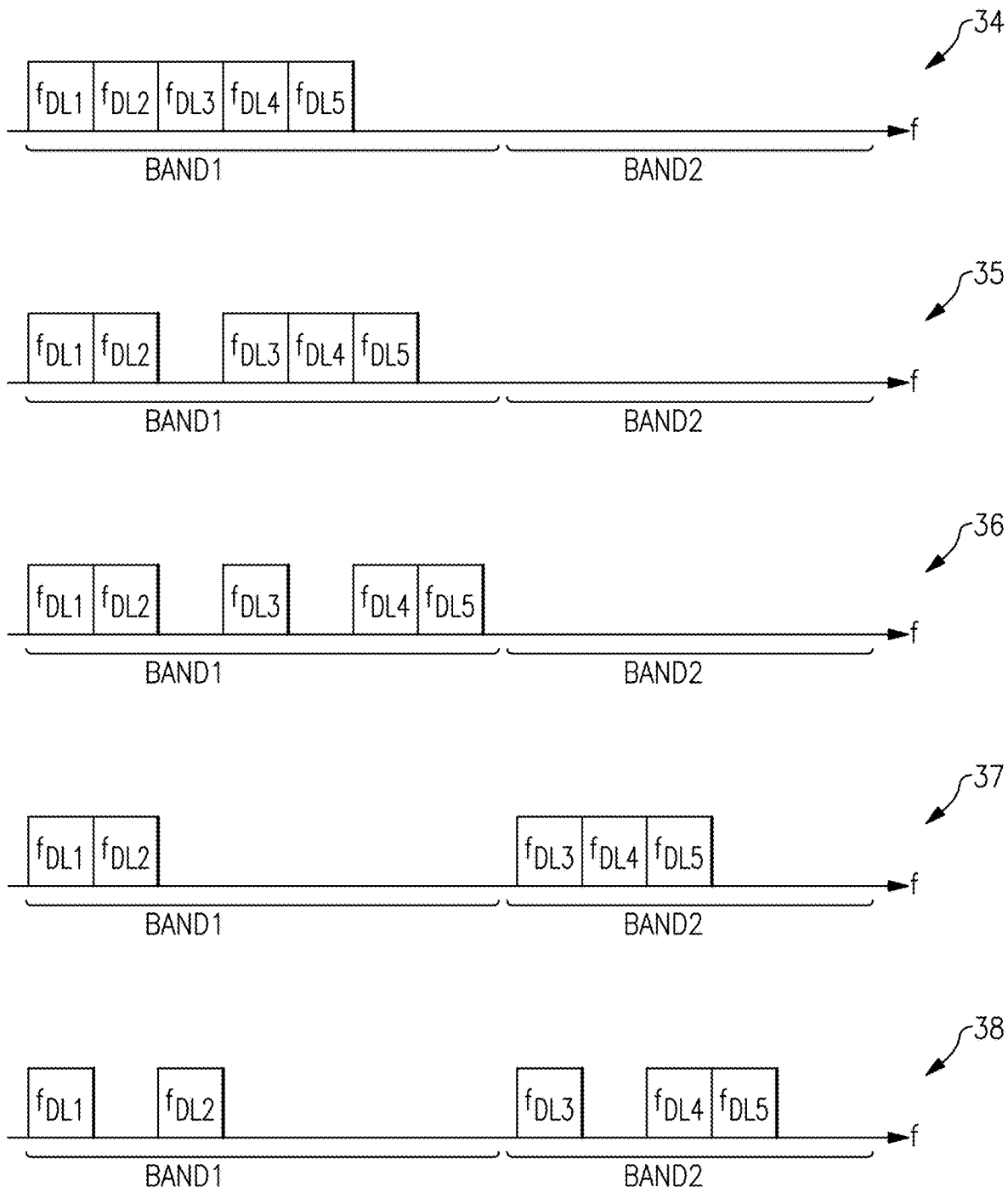
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
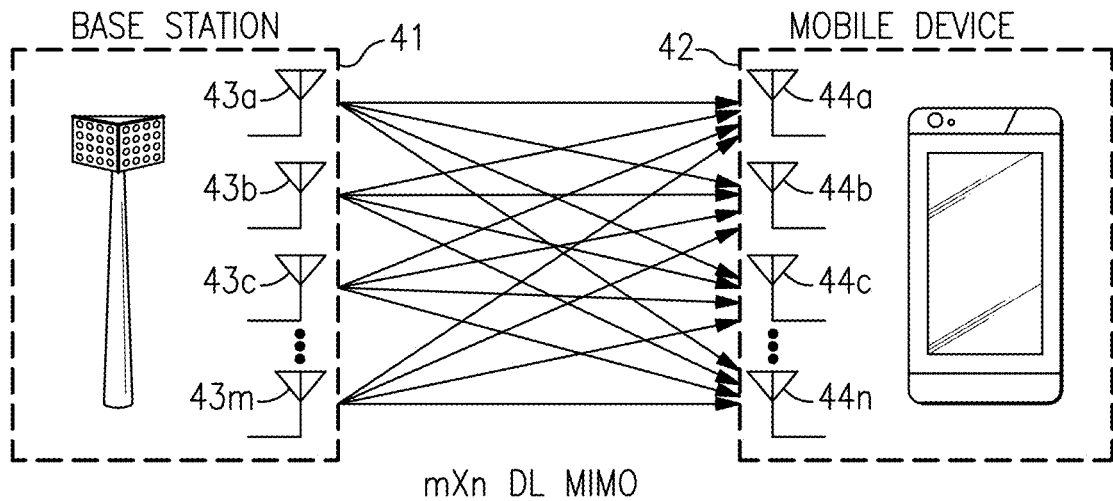
FIG. 3A is a schematic diagram of one example of a downlink channel using multi-input and multi-output (MIMO) communications.
Figure 3B:
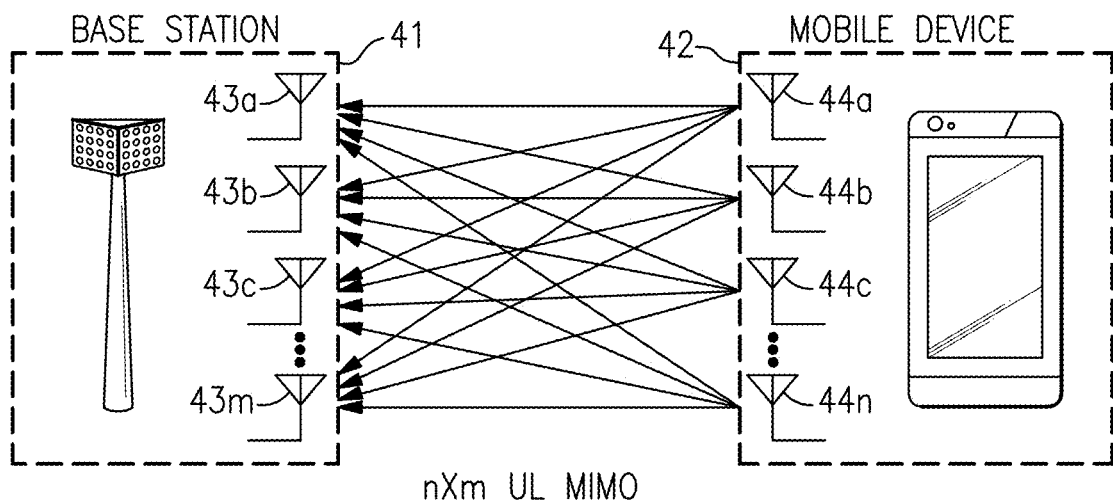
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
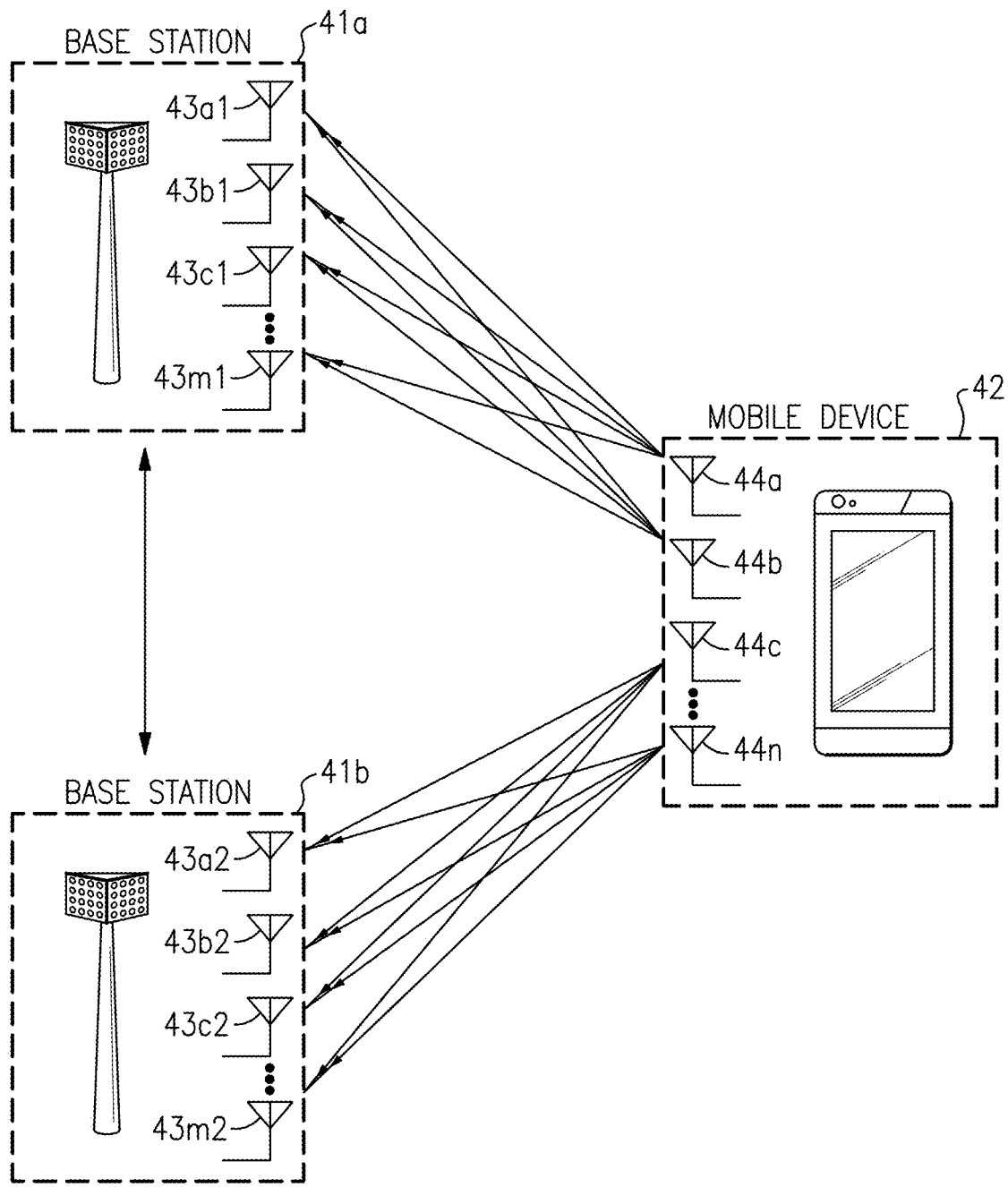
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4A:
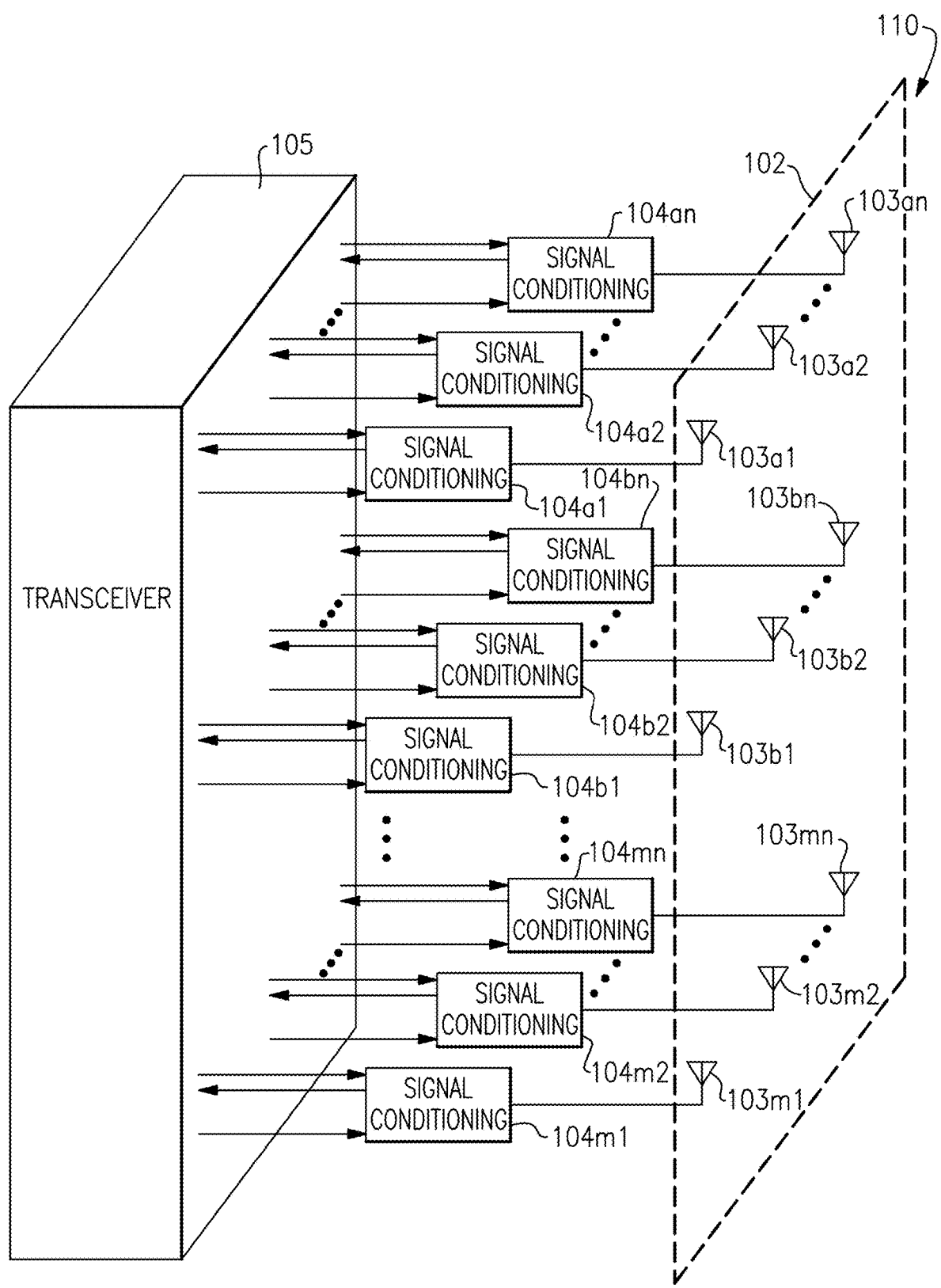
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
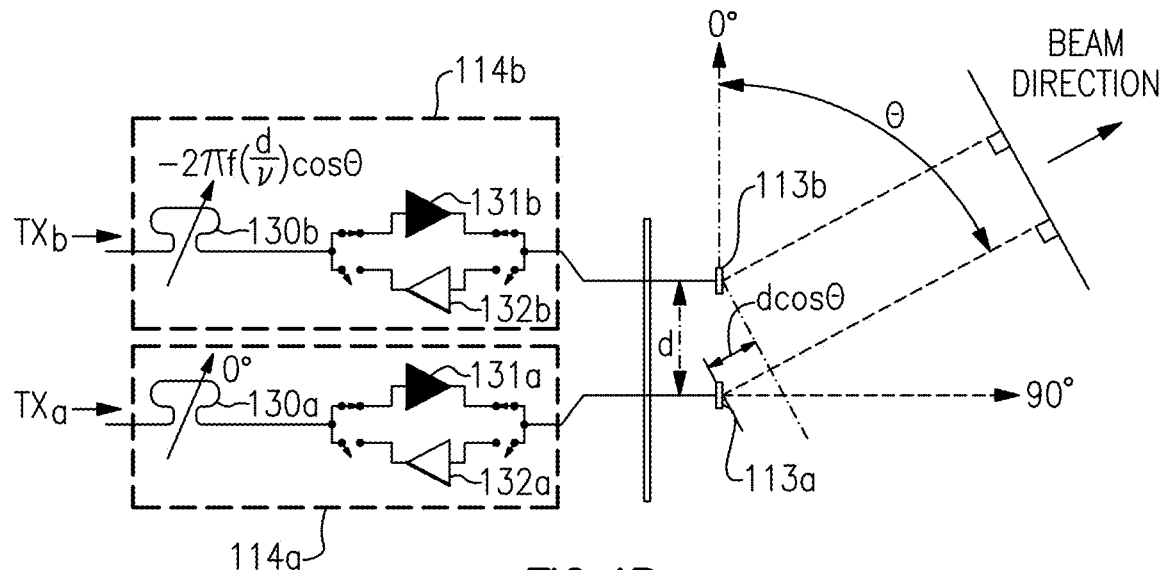
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle Θ can be achieved. For example, when the first phase shifter 130a has a reference value of 0°, the second phase shifter 130b can be controlled to provide a phase shift of about $-2\pi f(d/v)\cos \Theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi \cos \Theta$ radians to achieve a transmit beam angle Θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
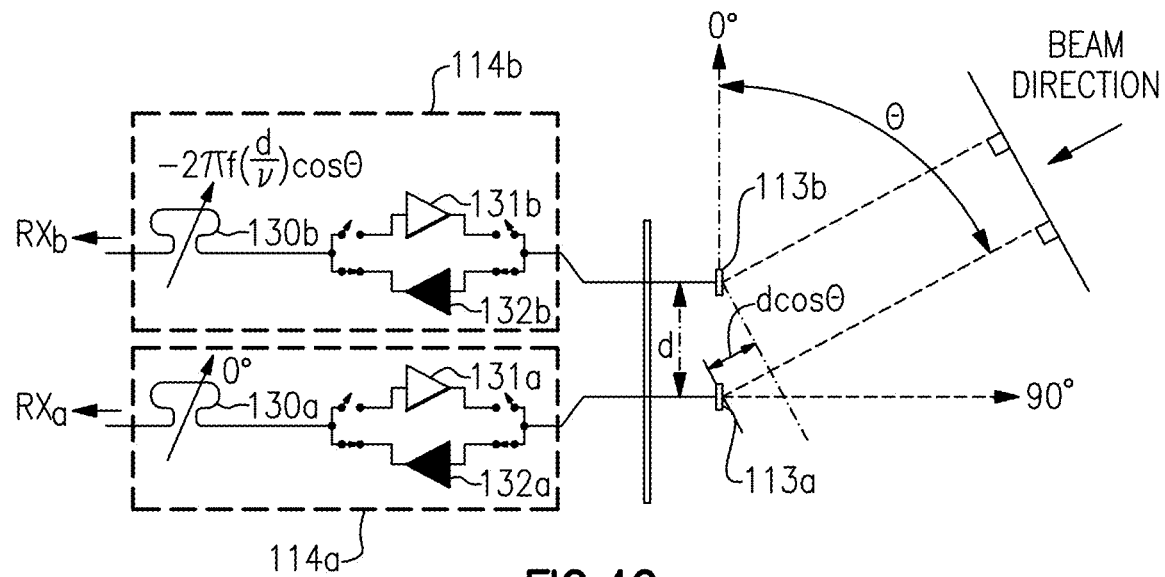
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos \Theta$ radians to achieve a desired receive beam angle Θ. In implementations in which the distance d corresponds to about ½λ, the phase difference can be selected to about equal to $-\pi \cos \Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Figure 5A:
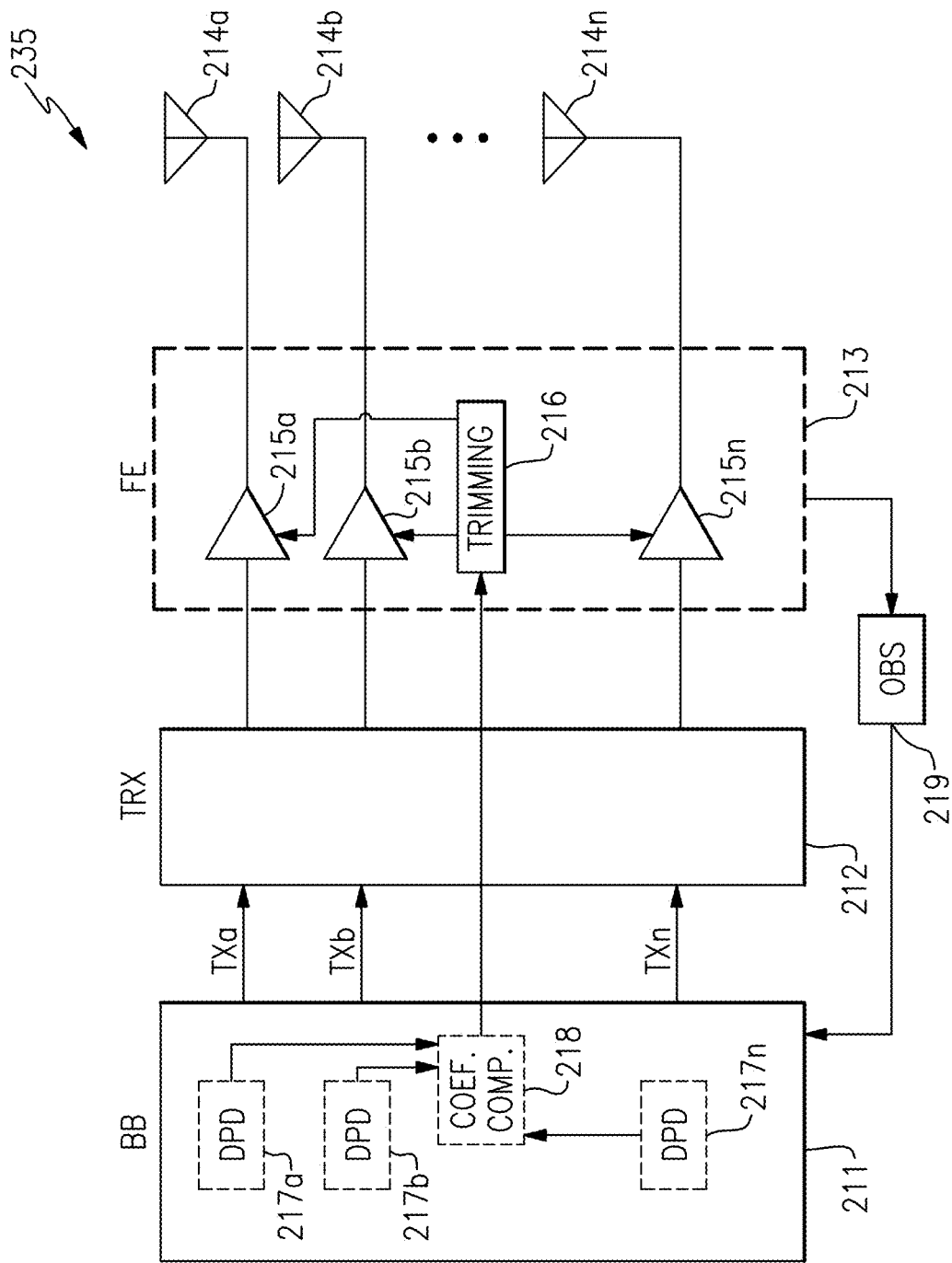
FIG. 5A is a schematic diagram of a communication system according to another embodiment.

FIG. 5A is a schematic diagram of a communication system 235 according to another embodiment. The communication system 235 includes a baseband processor 211, a transceiver 212, a front end system 213, an antenna array including antennas 214a, 214b, . . . 214n, and an observation receiver 219. The front end system 213 includes power amplifiers 215a, 215b, . . . 215n and a power amplifier trimming circuit 216 for providing trimming adjustments to the power amplifiers 215a, 215b, . . . 215n. The communication system 235 can correspond to a mobile device.

Digital pre-distortion (DPD) can be used to linearize a signal that is being transmitted by the communication system 235 by way of a transmit signal path. For example, nonlinearity from one of the power amplifiers and/or other components along the transmit signal paths can lead to in-band distortion, which can be quantified by error vector magnitude (EVM). For instance, EVM is a direct measurement of modulation accuracy and transmitter performance that captures an error vector between a measured signal and its corresponding ideal point in a signal constellation, such as a 16 quadrature amplitude modulation (QAM) constellation.

Using DPD can provide a flexible and robust mechanism for enhancing performance of a wide variety of communication systems, including modern ultra-wideband communication systems.

DPD operates in the digital domain (for instance, by digital processing in DPD engines 217a, 217b . . . 217n of the baseband processor 211 or other digital circuit) to construct a pre-distortion that is imposed on digital transmit data representing an RF signal that is being transmitted. The digital transmit data can be, for example, digital in-phase (I) and quadrature-phase (Q) signals that are subsequently converted to analog I and Q signals and modulated using an I/Q modulator to generate the RF signal for transmission. The pre-distortion provided by the DPD is anticipated to compensate for distortion arising from the power amplifiers and/or other components along the transmit signal path.

By using DPD, the power amplifiers 214a, 214b, . . . 214n and/or other components along the transmit signal paths can operate in a normally less linear regime, thereby leading to enhancements in efficiency. For example, using DPD can lead to an enhancement in a figure of merit of the power amplifiers, for instance, power added efficiency (PAE) and/or other measurements of the trade-off between amplifier linearity and efficiency.

In the illustrated embodiment, the baseband processor 211 generates transmit signals TXa, TXb, . . . TXn (each of which can be represented in an I/Q format), which are upconverted by the transceiver 212 and subsequently amplified by the power amplifiers 215a, 215b, . . . 215n, respectively. Additionally, the baseband processor 211 includes DPD engines 217a, 217b, . . . 217n for digitally pre-distorting the transmit signals TXa, TXb, . . . TXn. Such pre-distortion can be based on power amplifier output power observations detected by the observation receiver 219.

As shown in FIG. 5A, the front end system 213 includes the power amplifier trimming circuit 216 for trimming one or more of the power amplifiers 215a, 215b, . . . 215n to account for manufacturing variation and/or other types of variation. Although trimming provides a number of performance advantages, trimming also incurs overhead.

The power amplifiers 215a, 215b, . . . 215n can be trimmed in any suitable way, including, but not limited to, adjusting active transistors used for amplification (for example, changing transistor width and/or a number of active transistors), controlling capacitance values of internal feedback capacitors, adjusting bias, and/or adjusting a load line impedance. Thus, individual circuit settings of the power amplifiers 215a, 215b, . . . 215n can be established to provide individual adjustments to each power amplifier.

In the illustrated embodiment, the baseband processor 211 includes a coefficient comparator 218 for comparing the DPD coefficients used by the DPD engines 217a, 217b, . . . 217n. Additionally, the DPD coefficients are processed to determine when to initiate trimming of one or more of the power amplifiers 215a, 215b, . . . 215n by way of the power amplifier trimming circuit 216. In certain implementations, the coefficient comparator 218 also controls whether or not each of the DPD engines 217a, 217b, . . . 217n are active to provide DPD to each of the transmit signals TXa, TXb, . . . TXn, respectively. For example, each of the DPD engines 217a, 217b, . . . 217n can be active to provide DPD to each of the transmit signals TXa, TXb, . . . TXn, respectively, in a first mode. Furthermore, in a second mode, the coefficient comparator 218 can disable one or more of the DPD engines 217a, 217b, . . . 217n in favor of sharing another one of the DPD engines 217a, 217b, . . . 217n across two or more paths (and in some cases, sharing one DPD engine for all paths). Thus, in some modes, two or more of the transmit signals TXa, TXb, . . . TXn have DPD applied by a common DPD kernel associated with a particular DPD engine.

If one of more power amplifiers are trimmed such that they have similar DPD coefficients, then the same kernel or path of DPD can be used for this group of power amplifiers, thus reducing the number of DPD kernels active at a time and therefore reducing power consumption. Accordingly, in certain implementations, after trimming, one or more of the DPD engines 217a, 217b, . . . 217n can be disabled by the coefficient comparator 218 in favor of sharing another one of the DPD engines 217a, 217b, . . . 217n across two or more paths.

Accordingly, the coefficients used for DPD of the power amplifiers are processed to determine when to trim one or more of the power amplifiers 215a, 215b, . . . 215n. Thus, the communication system 235 compares DPD coefficients of different transmit channels to initiate power amplifier trimming as needed. By implementing the communication system 235 in this manner, improved efficiency, lower cost, and/or reduced overhead is realized by identifying times at which trimming is desirable.

The mathematical functions relating the adjustments to trimming with the DPD coefficients are quite complex, and therefore well-suited to be solved by modern techniques such as neural networks.

Accordingly, instead of trimming to fixed value in the factory, the trim coefficients are programmed dynamically in response to the DPD coefficients. Implementing trimming in this manner gives access to a broader space of tailored adjustments. One example of a very beneficial arrangement would be to trim internal feedback capacitors in the power amplifier based on the dispersion of memory coefficients, and converging to a memoryless setting. Once suitably trimmed, the DPD can be run memoryless, thus saving battery current in processing.

Another example is to adjust bias to improve the PA linearity and reduce the order of the DPD polynomial. Once these algorithms are applied to an array of power amplifiers, the high speed and energy consuming DPD calculations can be systematically reduced.

Figure 5B:
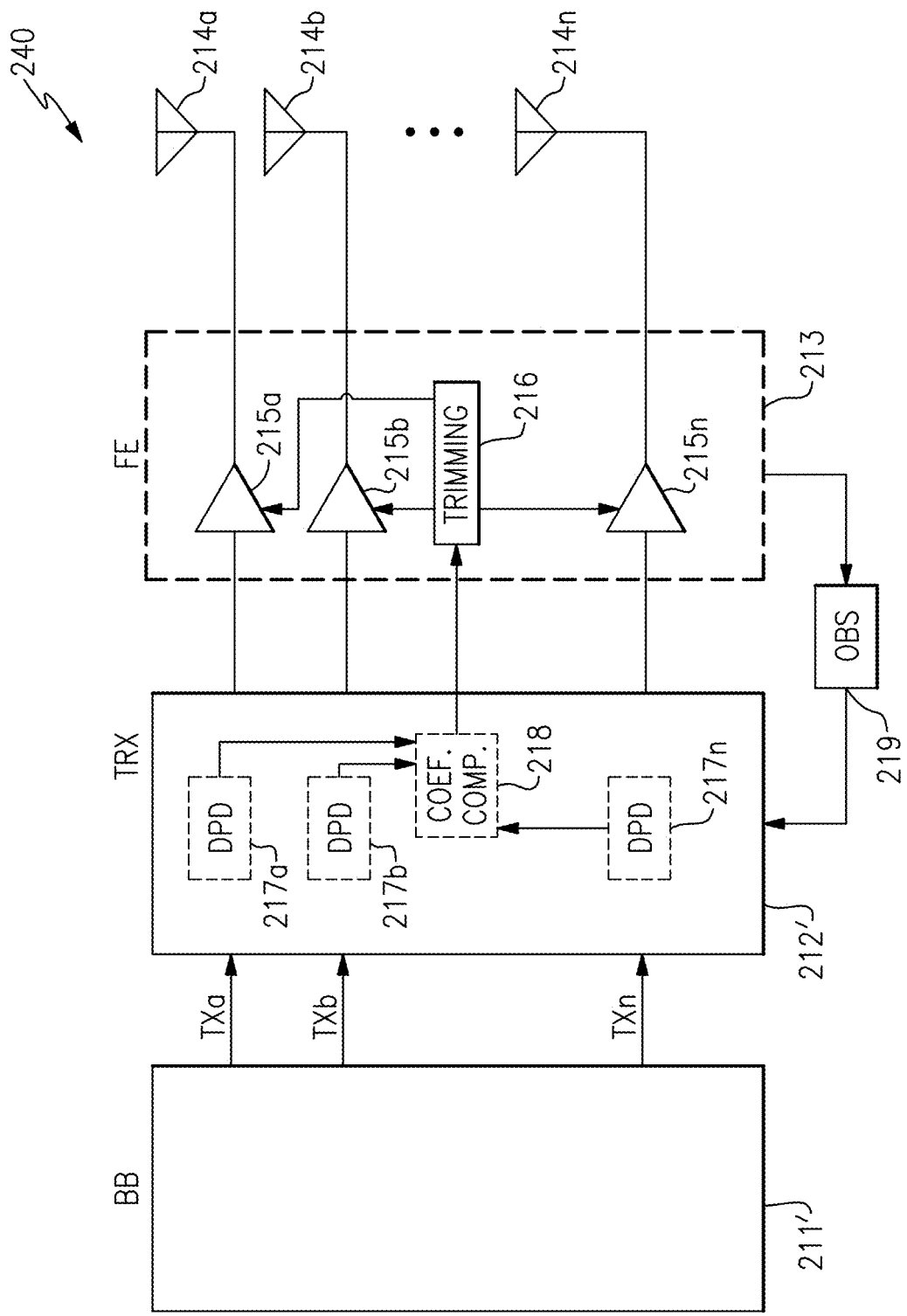
FIG. 5B is a schematic diagram of a communication system according to another embodiment.

FIG. 5B is a schematic diagram of a communication system 240 according to another embodiment. The communication system 240 includes a baseband processor 211', a transceiver 212', a front end system 213, an antenna array including antennas 214a, 214b, . . . 214n and an observation receiver 219.

The communication system 240 of FIG. 5B is similar to the communication system 235 of FIG. 5A, except that in the communication system 240 the DPD engines 217a, 217b, . . . 217n and the coefficient comparator 218 is implemented in the transceiver 212' rather than in a baseband processor.

DPD can be performed anywhere in the digital domain of a communication system.

Figure 5C:
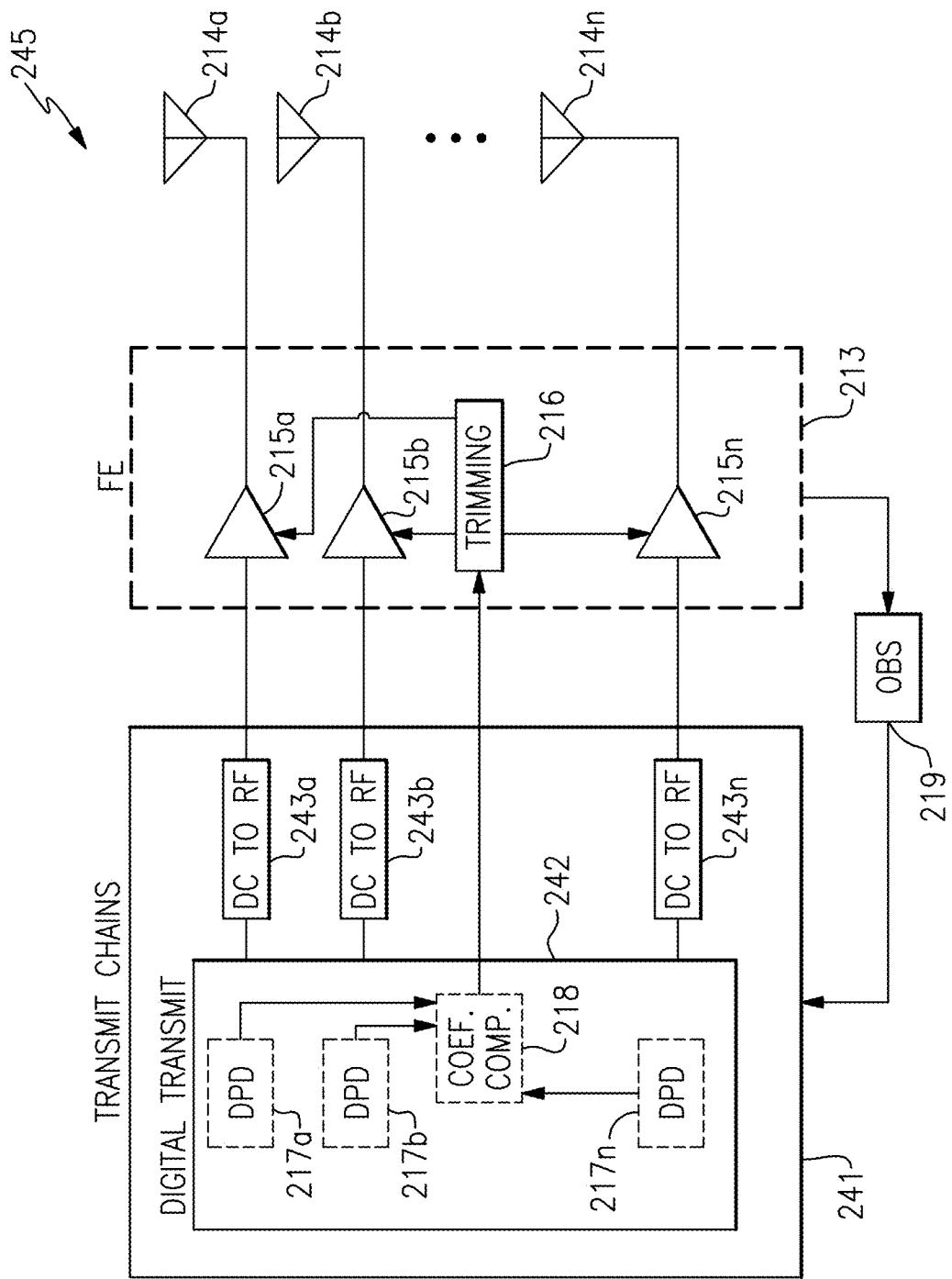
FIG. 5C is a schematic diagram of a communication system according to another embodiment.

FIG. 5C is a schematic diagram of a communication system 245 according to another embodiment. The communication system 245 includes transmit chains 241 (also referred to a transmit circuit), a front end system 213, an antenna array including antennas 214a, 214b, . . . 214n, and an observation receiver 219.

As shown in FIG. 5C, the transmit chains 257 includes a digital transmit circuit 242 and DC to RF components 243a, 243b, . . . 243n (for example, modulators or RF DACs, the DC to RF components also referred to herein as digital to RF converters).

The digital transmit circuit 242 includes DPD engines 217a, 217b, . . . 217n and the coefficient comparator 218. The digital transmit circuit 242 provides digital transmit signals to each of the DC to RF components 243a, 243b, . . . 243n to generate RF input signals for the front end system 213. In one mode, the coefficient comparator 218 activates each of the DPD engines 217a, 217b, . . . 217n such that each DPD engine provides DPD to a corresponding digital transmit signal provided to the DC to RF components 243a, 243b, . . . 243n. In another mode, the coefficient comparator 218 disables one or more of the DPD engines 217a, 217b, . . . 217n in favor of sharing a DPD engine across two or more of the paths. Thus, in some modes, two or more of the digital transmit signals provided to the DC to RF components 243a, 243b, . . . 243n have DPD applied by a common DPD kernel associated with a particular DPD engine.

The digital transmit circuit 242 can include digital transmit circuitry associated with a baseband processor and/or transceiver. In one example, the digital transmit circuit 242 is implemented in accordance with the embodiment of FIG. 5A. In another example, the digital transmit circuit 242 is implemented in accordance with the embodiment of FIG. 5B.

Figure 5D:
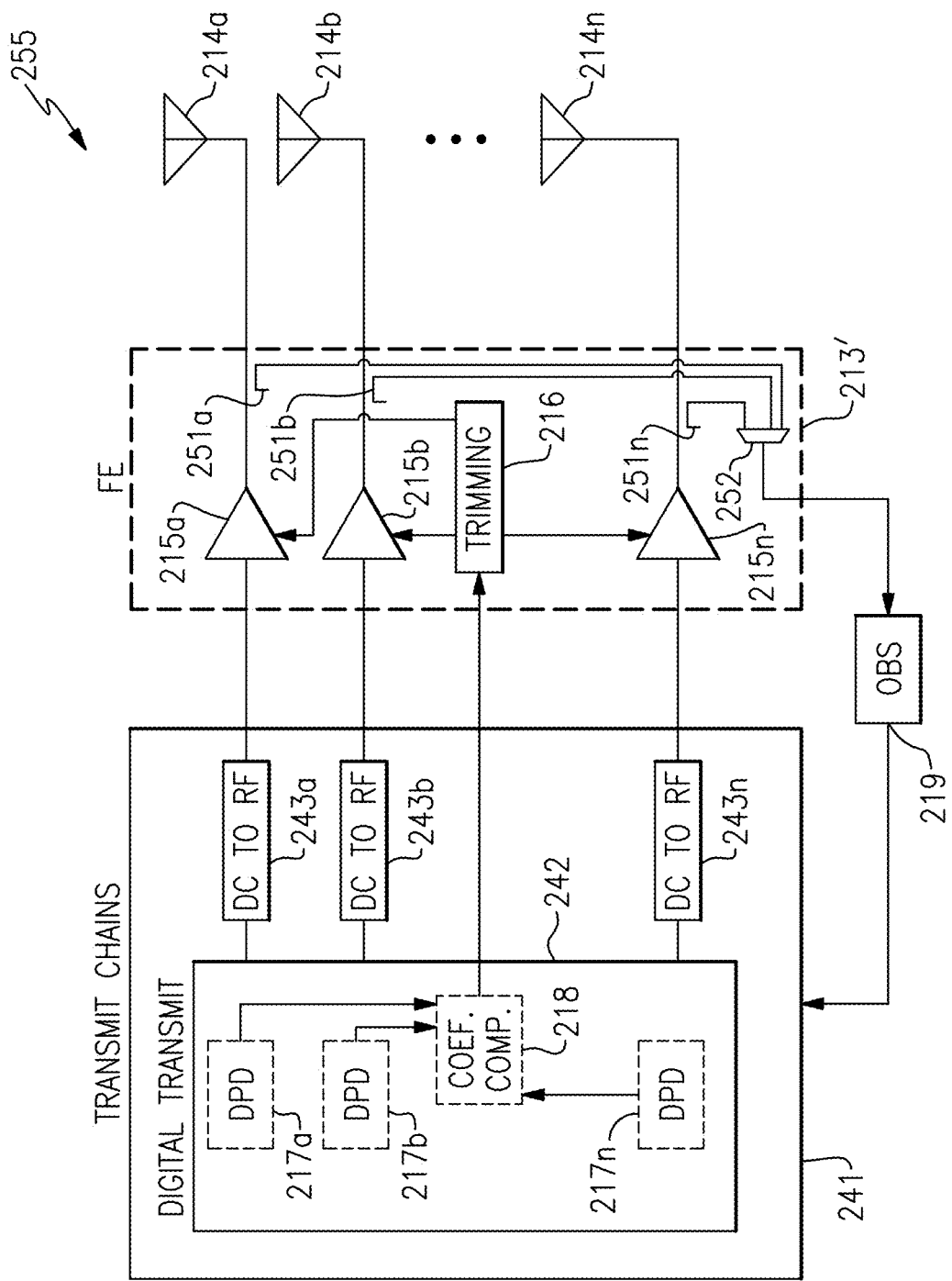
FIG. 5D is a schematic diagram of a communication system according to another embodiment.

FIG. 5D is a schematic diagram of a communication system 255 according to another embodiment. The communication system 255 includes transmit chains 241, a front end system 213', an antenna array including antennas 214a, 214b, . . . 214n, and an observation receiver 219.

The communication system 255 of FIG. 5D is similar to the communication system 245 of FIG. 5C, except that the communication system 255 of FIG. 5D illustrates a specific implementation of power amplifier output observation in the front end system 213'. As shown in FIG. 5D, the front end system 213' includes power amplifiers 215a, 215b, . . . 215n, a power amplifier trimming circuit 216, directional couplers 215a, 215b, . . . 215n, and a multiplexer 216.

In the illustrated embodiment, power amplifier output observations are made by multiplexing directional couplers 251a, 251b, . . . 251n each coupled to an output of a respective one of the power amplifiers 215a, 215b, . . . 215n. The selected observation by the multiplexer 216 is provided to the observation receiver 219. The selected observation can be changed over time to observe a desired power amplifier output. Although one configuration of power amplifier observation is depicted, any suitable implementation of power amplifier observation can be used in accordance with the teachings herein.

Figure 5E:
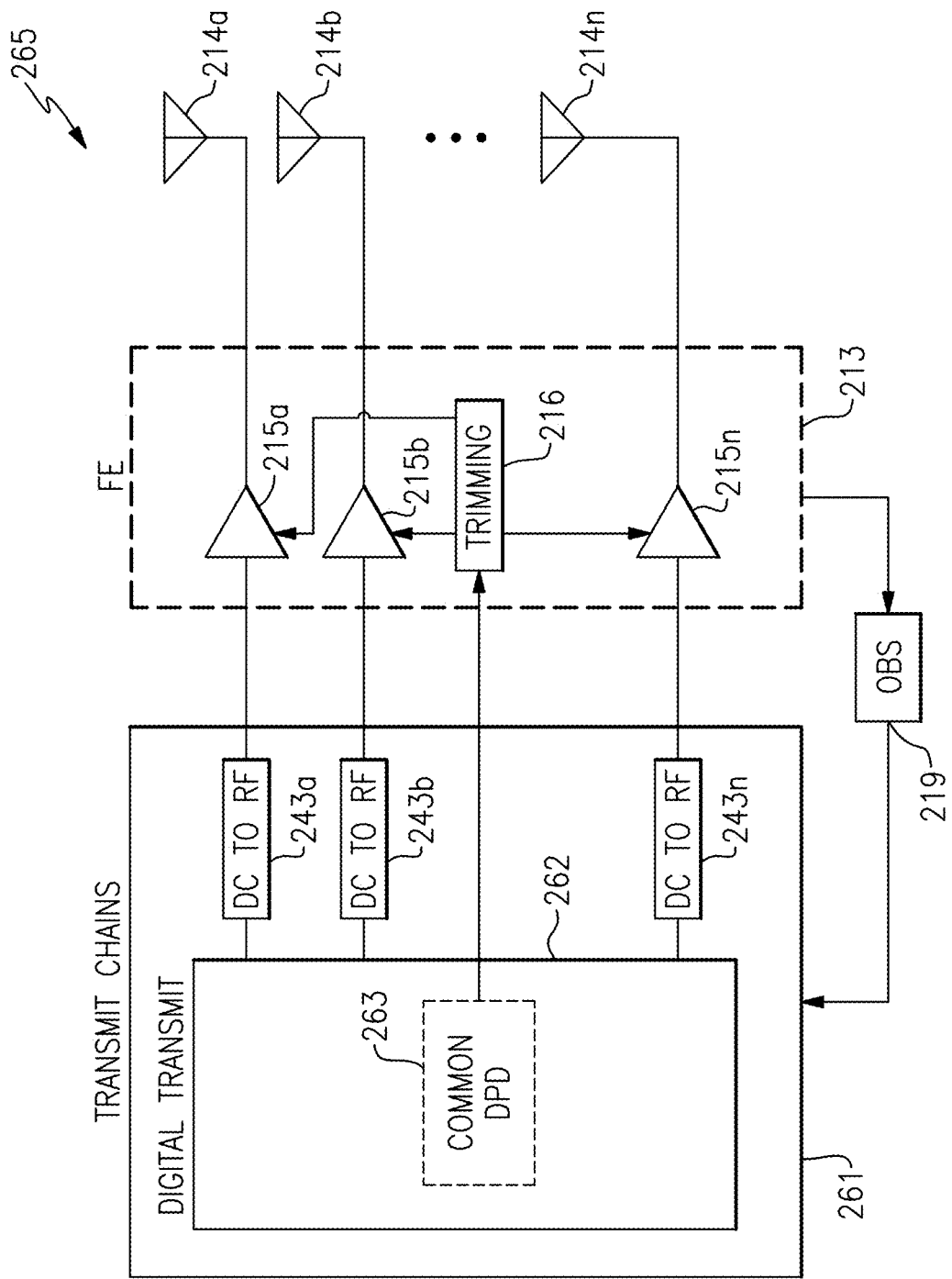
FIG. 5E is a schematic diagram of a communication system according to another embodiment.

FIG. 5E is a schematic diagram of a communication system 265 according to another embodiment. The communication system 265 includes transmit chains 261, a front end system 213, antennas 214a, 214b, . . . 214n, and an observation receiver 219. The front end system 213 includes power amplifiers 215a, 215b, . . . 215n and a power amplifier trimming circuit 216 for providing trimming adjustments to the power amplifiers 215a, 215b, . . . 215n. The transmit chains 261 include a digital transmit circuit 262 and DC to RF components 243a, 243b, . . . 243n.

In comparison to the communication system 245 of FIG. 5C, the communication system 265 of FIG. 5E includes a digital transmit circuit 262 with a common DPD engine 263 for controlling DPD applied to each digital transmit signal provided to the DC to RF components 243a, 243b, . . . 243n. In the illustrated embodiment, each power amplifier 215a, 215b, . . . 215n has been trimmed such that each power amplifier can operate with the same DPD kernel.

Figure 5F:
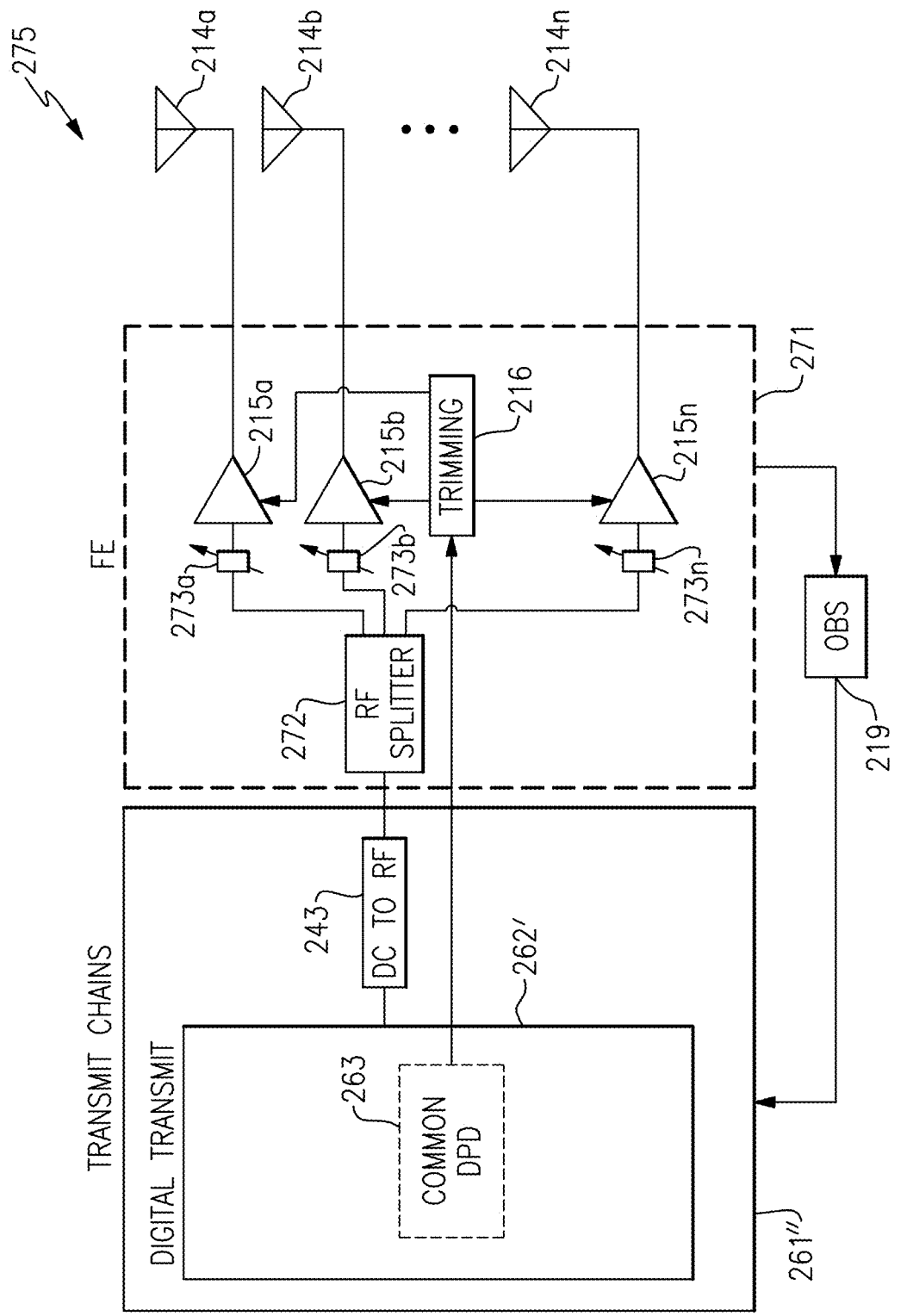
FIG. 5F is a schematic diagram of a communication system according to another embodiment.

FIG. 5F is a schematic diagram of a communication system 275 according to another embodiment. The communication system 265 includes transmit chains 261", a front end system 271, antennas 214a, 214b, . . . 214n, and an observation receiver 219.

The communication system 275 of FIG. 5F is similar to the communication system 265 of FIG. 5E, except that the communication system 275 depicts one implementation of RF splitting. In particular, an RF signal from a DC to RF component 243 of the transmit chains 261" is split by an RF splitter 272 of the front end system 271, and thereafter each RF input signal is gain and phase adjusted by the gain and phase adjustment components 273a, 273b, . . . 273n. The gain and phase adjusted RF input signals from the gain and phase adjustment components 273a, 273b, . . . 273n are provided to power amplifiers 215a, 215b, . . . 215n, respectively.

The front end system configuration of FIG. 5F depicts one example of gain and phase adjustment in the RF domain for beamforming. Any of the embodiments herein can include gain and phase adjustments in the RF domain for beamforming. Moreover, any of the embodiments herein can include one or more RF splitters for splitting a particular RF input signal input multiple RF input signals that are thereafter gain and phase adjusted for beamforming.

The communication system herein can provide beamforming for signals of a variety of frequencies. In certain implementations, the RF input signals that are gain and phase adjusted for beamforming correspond to FR2 signals or millimeter wave signals. Table 1 below depicts various examples of 5G FR2 frequency bands, and correspond to example frequency bands for the RF input signals provided to the power amplifiers 215a, 215b, . . . 215n.

TABLE 1

| 5G Frequency Band | Band Duplex Type | UL/DL Low [MHz] | UL/DL High [MHz] |
|---|---|---|---|
| n257 | TDD | 26500 | 29500 |
| n258 | TDD | 24250 | 27500 |
| n259 | TDD | 39500 | 43500 |
| n260 | TDD | 37000 | 40000 |
| n261 | TDD | 27500 | 28350 |
| n262 | TDD | 47200 | 48200 |
| n263 | TDD | 57000 | 71000 |

Figure 6A:
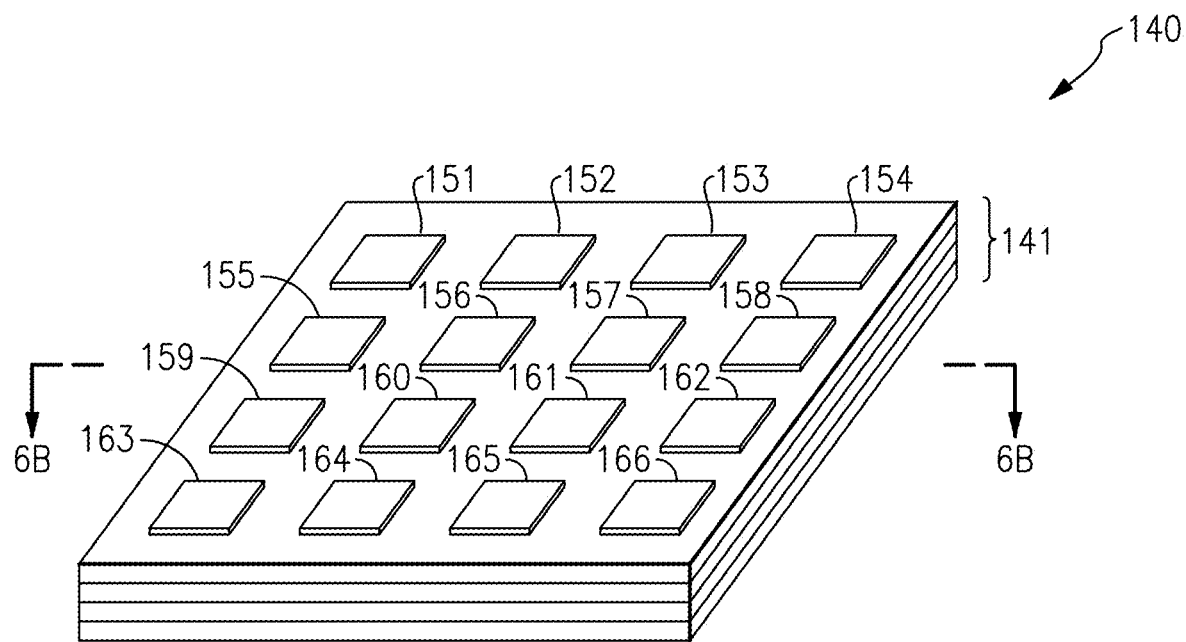
FIG. 6A is a perspective view of one embodiment of a module that operates with beamforming.
Figure 6B:
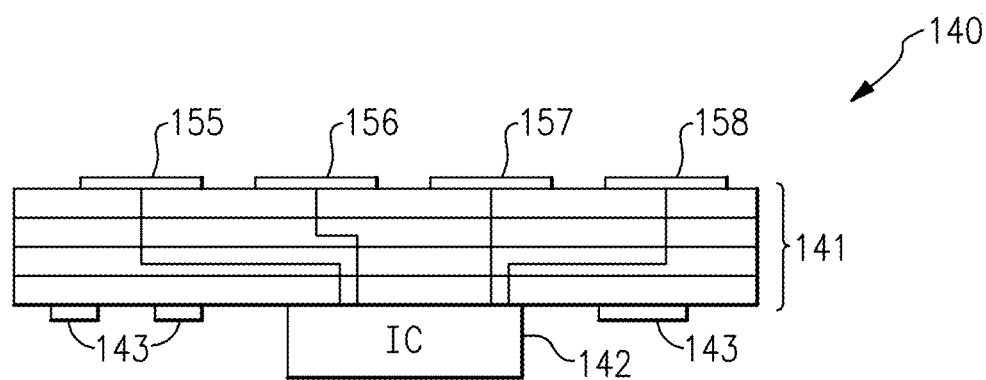
FIG. 6B is a cross-section of the module of FIG. 6A taken along the lines 6B-6B.

FIG. 6A is a perspective view of one embodiment of a module 140 that operates with beamforming. FIG. 6B is a cross-section of the module 140 of FIG. 6A taken along the lines 6B-6B.

The module 140 includes a laminated substrate or laminate 141, a semiconductor die or IC 142, surface mount components 143, and an antenna array including patch antenna elements 151-166.

Although one embodiment of a module is shown in FIGS. 6A and 6B, the teachings herein are applicable to modules implemented in a wide variety of ways. For example, a module can include a different arrangement of and/or number of antenna elements, dies, and/or surface mount components. Additionally, the module 140 can include additional structures and components including, but not limited to, encapsulation structures, shielding structures, and/or wirebonds.

In the illustrated embodiment, the antenna elements 151-166 are formed on a first surface of the laminate 141, and can be used to transmit receive signals or to transmit and receive signals. Although the illustrated antenna elements 151-166 are rectangular, the antenna elements 151-166 can be shaped in other ways. Additionally, although a 4×4 array of antenna elements is shown, more or fewer antenna elements can be provided. Moreover, antenna elements can be arrayed in other patterns or configurations. Furthermore, in another embodiment, multiple antenna arrays are provided, such as separate antenna arrays for transmit and receive and/or multiple antenna arrays for MIMO and/or switched diversity.

In certain implementations, the antenna elements 151-166 are implemented as patch antennas. A patch antenna can include a planar antenna element positioned over a ground plane. A patch antenna can have a relatively thin profile and exhibit robust mechanical strength. In certain configurations, the antenna elements 151-166 are implemented as patch antennas with planar antenna elements formed on the first surface of the laminate 141 and the ground plane formed using an internal conductive layer of the laminate 141.

Although an example with patch antennas is shown, a module can include any suitable antenna elements, including, but not limited to, patch antennas, dipole antennas, ceramic resonators, stamped metal antennas, and/or laser direct structuring antennas.

In the illustrated embodiment, the IC 142 and the surface mount components 143 are on a second surface of the laminate 141 opposite the first surface.

The IC 142 includes signal conditioning circuits associated with the antenna elements 151-166 and including one or more power amplifiers. The IC can also include a transmit chains including DPD circuits and a DPD coefficient comparator implemented in accordance with the teachings herein.

In certain implementations, the IC 142 includes a serial interface, such as a mobile industry processor interface radio frequency front-end (MIPI RFFE) bus and/or inter-integrated circuit ($I^2C$) bus that receives data for controlling the signal conditioning circuits, such as the amount of phase shifting provided by phase shifters.

The laminate 141 can be implemented in a variety of ways, and can include for example, conductive layers, dielectric layers, solder masks, and/or other structures. The number of layers, layer thicknesses, and materials used to form the layers can be selected based on a wide variety of factors, which can vary with application. The laminate 141 can include vias for providing electrical connections to signal feeds and/or ground feeds of the antenna elements 151-166. For example, in certain implementations, vias can aid in providing electrical connections between signaling conditioning circuits of the IC 142 and corresponding antenna elements.

The module 140 can be included in a communication system, such as a mobile phone or base station. In one example, the module 140 is attached to a phone board of a mobile phone.

Figure 7:
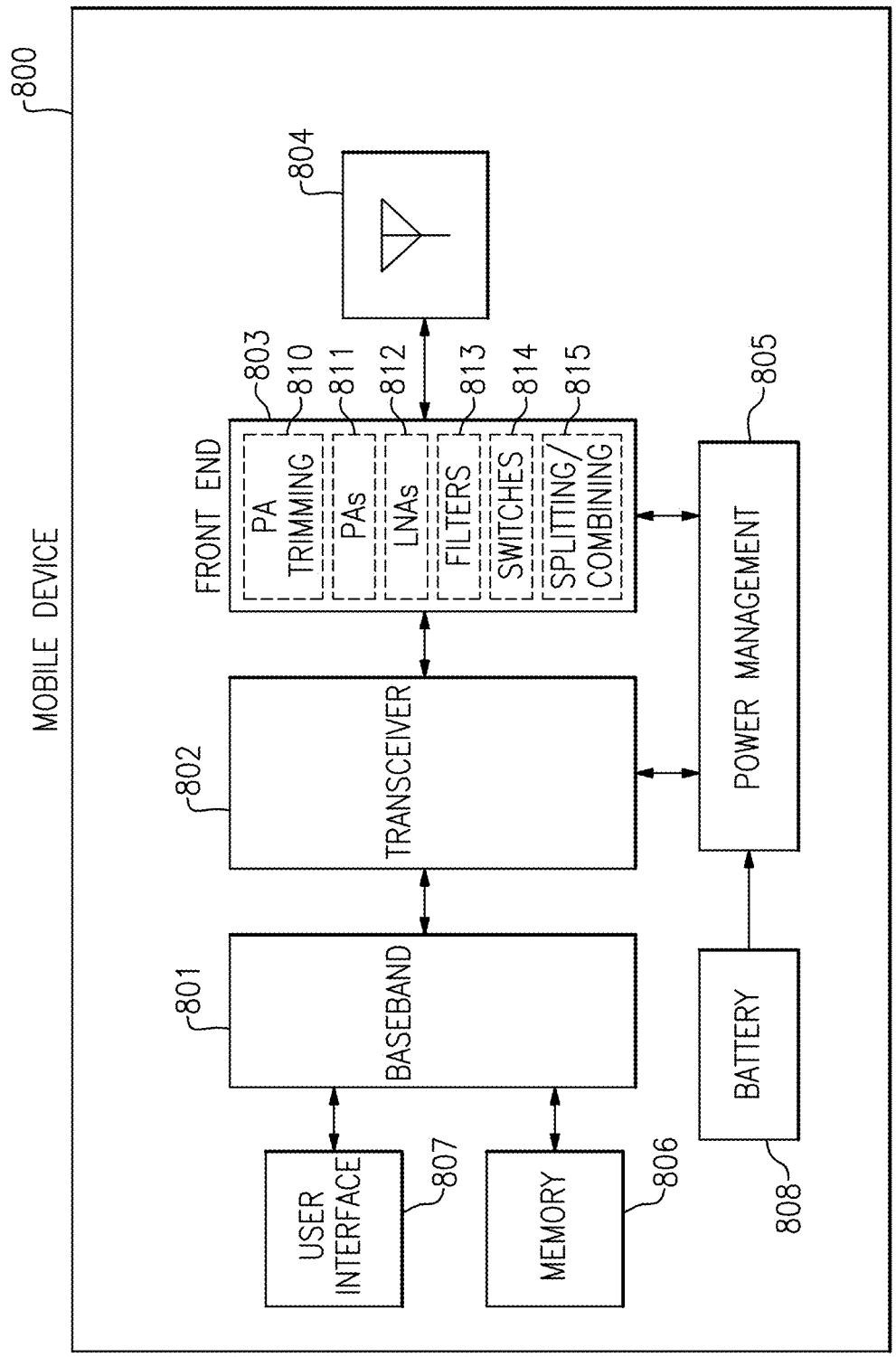
FIG. 7 is a schematic diagram of one embodiment of a mobile device.

FIG. 7 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes power amplifier trimming circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 8A:
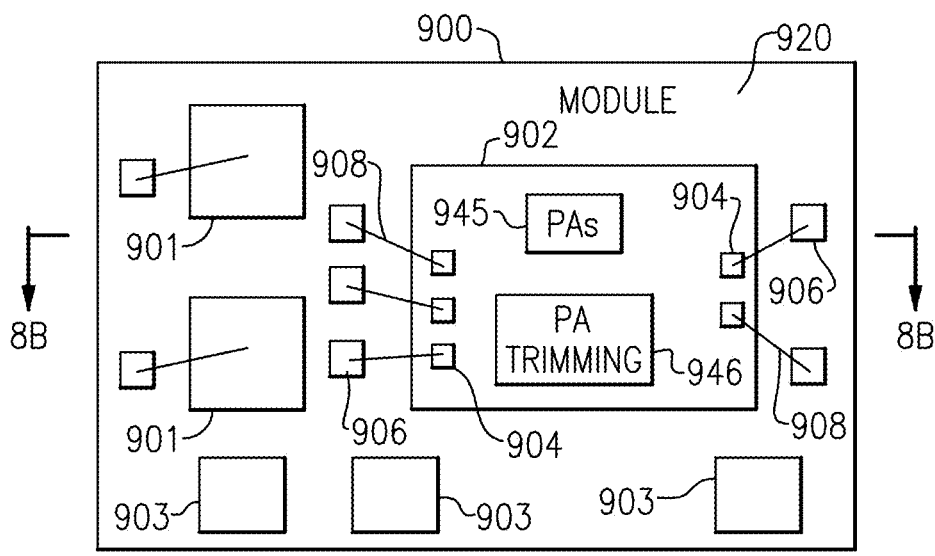
FIG. 8A is a schematic diagram of one embodiment of a power amplifier module.
Figure 8B:
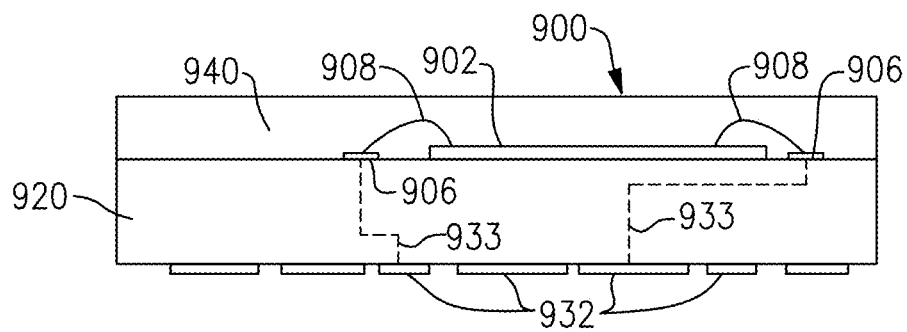
FIG. 8B is a schematic diagram of a cross-section of the power amplifier module of FIG. 8A taken along the lines 8B-8B.

FIG. 8A is a schematic diagram of one embodiment of a power amplifier module 900. FIG. 8B is a schematic diagram of a cross-section of the power amplifier module 900 of FIG. 8A taken along the lines 8B-8B.

The power amplifier module 900 includes radio frequency components 901, a semiconductor die 902, surface mount devices 903, wirebonds 908, a package or module substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes power amplifiers 945 and power amplifier trimming circuitry 946, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 8B, the power amplifier module 900 is shown to include a plurality of contact pads 932 disposed on the side of the power amplifier module 900 opposite the side used to mount the semiconductor die 902. Configuring the power amplifier module 900 in this manner can aid in connecting the power amplifier module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 8B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the power amplifier module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the power amplifier module 900 is described in the context of electrical connections based on wirebonds, one or more features of the present disclosure can also be implemented in other packaging configurations, including, for example, flip-chip configurations.

Figure 9A:
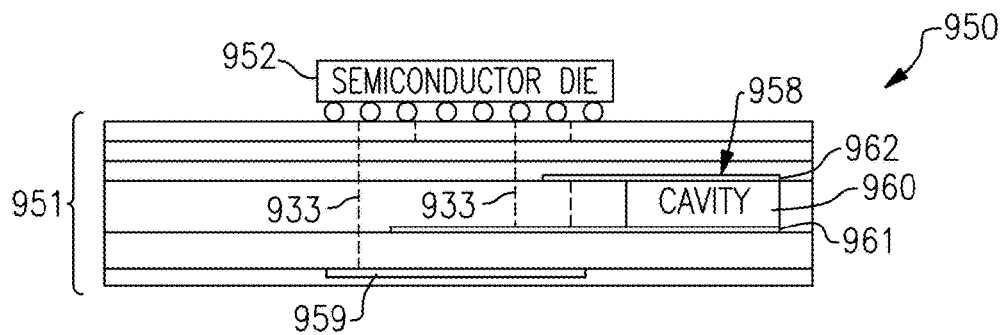
FIG. 9A is a schematic diagram of a cross-section of another embodiment of a power amplifier module.

FIG. 9A is a schematic diagram of a cross-section of another embodiment of a power amplifier module 950. The power amplifier module 950 includes a laminated package substrate 951 and a flip-chip die 952.

The laminated package substrate 951 includes a cavity-based antenna 958 associated with an air cavity 960, a first conductor 961, a second conductor 962. The laminated package substrate 951 further includes a planar antenna 959.

In certain implementations herein, a power amplifier module includes one or more integrated antennas. For example, the power amplifier module 950 of FIG. 9A includes the cavity-based antenna 958 and the planar antenna 959. By including antennas facing in multiple directions (including, but not limited to, directions that are substantially perpendicular to one another), a range of available angles for communications can be increased. Although one example of a power amplifier module with integrated antennas is shown, the teachings herein are applicable to modules implemented in a wide variety of ways.

Figure 9B:
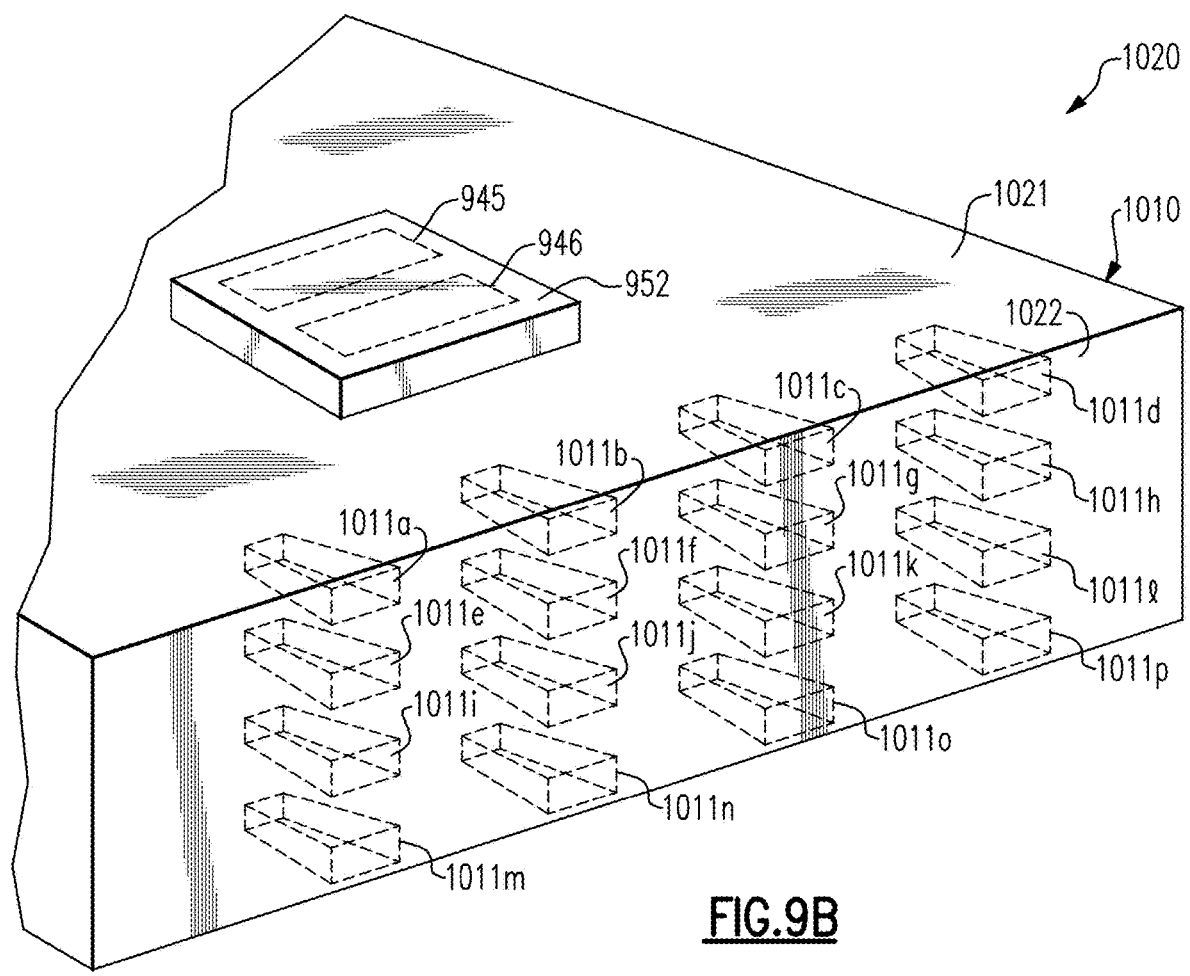
FIG. 9B is a perspective view of another embodiment of a power amplifier module.

FIG. 9B is a perspective view of another embodiment of a power amplifier module 1020. The module 1020 includes a laminated substrate 1010 and a semiconductor die 1012. The semiconductor die 1012 includes power amplifiers 945 and power amplifier trimming circuitry 946. In certain implementations, the semiconductor die 1012 includes other RF circuitry, which can include, for example, variable gain amplifiers (VGAs), controllable phase shifters, switches, filters, and/or transceivers.

In the illustrated the embodiment, cavity-based antennas 1011a-1011p have been formed on an edge 1022 of the laminated substrate 1010. In this example, sixteen cavity-based antennas have been provided in a four-by-four (4×4) array. However, more or fewer antennas can be included and/or antennas can be arrayed in other patterns.

In another embodiment, the laminated substrate 1010 further include another antenna array (for example, a patch antenna array) formed on a second major surface of the laminated substrate 1010 opposite the first major surface 1021. Implementing the module 1020 aids in increasing a range of angles over which the module 1020 can communicate.

The module 1020 illustrates another embodiment of a module including an array of antennas that are controllable to provide beamforming. Implementing an array of antennas on a side of module aids in communicating at certain angles and/or directions that may otherwise be unavailable due to environmental blockage. Although an example with cavity-based antennas is shown, the teachings herein are applicable to implementations using other types of antennas.

Figure 10:
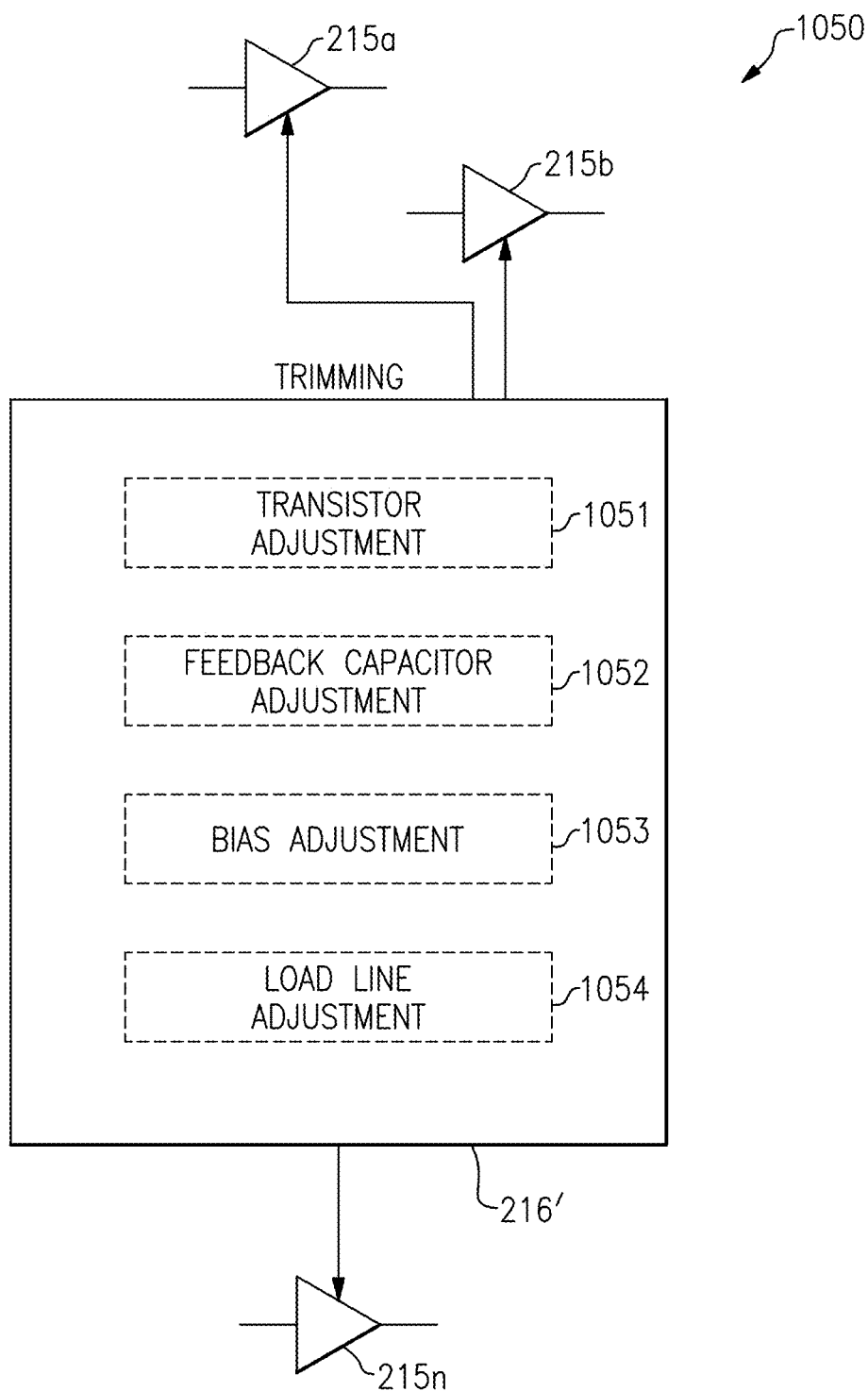
FIG. 10 is a schematic diagram of a power amplifier trimming system according to one embodiment.

FIG. 10 is a schematic diagram of a power amplifier trimming system 1050 according to one embodiment. The power amplifier trimming system 1050 includes a trimming circuit 216' for providing individual trimming to each of a plurality of power amplifiers 215a, 215b, . . . 215n. In this example, the trimming circuit 216' includes one or more of a transistor adjustment component 1051 for adjusting transistors of the power amplifiers, a feedback capacitor adjustment component 1052 for adjusting feedback capacitors of the power amplifiers, a bias adjustment component 1053 for adjusting bias of the power amplifiers, and a load line adjustment component 1054 for adjusting a load line of the power amplifiers.

Although examples of power amplifier trimming are depicted, the power amplifiers herein can be trimmed in any suitable way.

Applications

Some of the embodiments described above have provided examples in connection with wireless devices or mobile phones. However, the principles and advantages of the embodiments can be used for any other systems or apparatus that have needs for power amplifiers.

Such power amplifiers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transmit circuit configured to generate a plurality of digital transmit signals, the transmit circuit including a plurality of digital pre-distortion circuits each operable to provide digital pre-distortion to a corresponding one of the plurality of digital transmit signals in a first mode of the transmit circuit, a coefficient comparator circuit configured to generate a trimming control signal based on a plurality of coefficients of the plurality of digital pre-distortion circuits, and a plurality of digital to radio frequency converters configured to convert the plurality of digital transmit signals into a plurality of radio frequency signals; and
a front end system including a plurality of power amplifiers each configured to amplify a respective one of the plurality of radio frequency signals, and a power amplifier trimming circuit configured to control trimming of the plurality of power amplifiers based on the trimming control signal.

2. The mobile device of claim 1 wherein in a second mode of the transmit circuit, a digital pre-distortion circuit of the plurality of digital pre-distortion circuits is configured to provide digital pre-distortion to two or more of the plurality of digital transmit signals.

3. The mobile device of claim 2 wherein at least one of the plurality of digital pre-distortion circuits is disabled in the second mode to lower a power consumption of the transmit circuit.

4. The mobile device of claim 2 wherein the transmit circuit transitions from the first mode to the second mode after the power amplifier trimming circuit trims the plurality of power amplifiers in response to the trimming control signal.

5. The mobile device of claim 1 wherein the power amplifier trimming circuit is configured to provide at least one of a transistor adjustment, a feedback capacitor adjustment, a bias adjustment, or a load line adjustment to one or more of the plurality of power amplifiers based on the trimming control signal.

6. The mobile device of claim 1 further comprising an antenna array configured to radiate a transmit beam in response to receiving a plurality of amplified radio frequency signals from the plurality of power amplifiers.

7. The mobile device of claim 1 wherein the coefficient comparator circuit is configured to generate the trimming control signal based on a plurality of comparisons of the plurality of coefficients to one another.

8. The mobile device of claim 1 wherein the front end system further includes a plurality of gain and phase adjustment circuits configured to provide a plurality of gain and phase adjustments to the plurality of radio frequency signals for beamforming.

9. A method of digital pre-distortion in a mobile device, the method comprising:
using a transmit circuit to generate a plurality of digital transmit signals, and to convert the plurality of digital transmit signals to a plurality of radio frequency signals;
in a first mode of the transmit circuit, providing digital pre-distortion to each of the plurality of digital transmit signals using a plurality of digital pre-distortion circuits of the transmit circuit;
generating a trimming control signal based on a plurality of coefficients of the plurality of digital pre-distortion circuits using a coefficient comparator of the transmit circuit;
amplifying the plurality of radio frequency signals using a plurality of power amplifiers; and
trimming the plurality of power amplifiers based on the trimming control signal using a power amplifier trimming circuit.

10. The method of claim 9 further comprising using a digital pre-distortion circuit of the plurality of digital pre-distortion circuits to provide digital pre-distortion to two or more of the plurality of digital transmit signals in a second mode of the transmit circuit.

11. The method of claim 10 further comprising disabling at least one of the plurality of digital pre-distortion circuits in the second mode.

12. The method of claim 10 further comprising transitioning the transmit circuit from the first mode to the second mode after trimming the plurality of power amplifiers in response to the trimming control signal.

13. The method of claim 9 wherein trimming the plurality of power amplifiers includes at least one of providing a transistor adjustment, providing a feedback capacitor adjustment, providing a bias adjustment, or providing a load line adjustment to one or more of the plurality of power amplifiers based on the trimming control signal.

14. The method of claim 9 further comprising radiating a transmit beam from an antenna array in response to receiving a plurality of amplified radio frequency signals from the plurality of power amplifiers.

15. The method of claim 9 wherein generating the trimming control signal includes performing a plurality of comparisons of the plurality of coefficients to one another.

16. The method of claim 9 further comprising providing a plurality of gain and phase adjustments to the plurality of radio frequency signals for beamforming using a plurality of gain and phase adjustment circuits.

17. A radio frequency transmit system for a mobile device, the radio frequency transmit system comprising:
a digital transmit circuit configured to generate a plurality of digital transmit signals, the digital transmit circuit including a plurality of digital pre-distortion circuits each operable to provide digital pre-distortion to a corresponding one of the plurality of digital transmit signals in a first mode of the digital transmit circuit, and a coefficient comparator circuit configured to generate a trimming control signal based on a plurality of coefficients of the plurality of digital pre-distortion circuits;
a plurality of digital to radio frequency converters configured to convert the plurality of digital transmit signals into a plurality of radio frequency signals; and
a power amplifier module including a plurality of power amplifiers each configured to amplify a respective one of the plurality of radio frequency signals, and a power amplifier trimming circuit configured to control trimming of the plurality of power amplifiers based on the trimming control signal.

18. The radio frequency transmit system of claim 17 wherein in a second mode of the digital transmit circuit, a digital pre-distortion circuit of the plurality of digital pre-distortion circuits is configured to provide digital pre-distortion to two or more of the plurality of digital transmit signals.

19. The radio frequency transmit system of claim 18 wherein at least one of the plurality of digital pre-distortion circuits is disabled in the second mode to lower a power consumption of the transmit circuit.

20. The radio frequency transmit system of claim 18 wherein the transmit circuit transitions from the first mode to the second mode after the power amplifier trimming circuit trims the plurality of power amplifiers in response to the trimming control signal.

* * * * *